(12) United States Patent
Nam et al.

(10) Patent No.: US 12,061,796 B2
(45) Date of Patent: Aug. 13, 2024

(54) STORAGE DEVICE AND OPERATION METHOD THEREOF

(71) Applicant: Samsung Electronics Co., Ltd., Suwon-si (KR)

(72) Inventors: Gyeongmin Nam, Seoul (KR); Chanha Kim, Hwaseong-si (KR); Seungryong Jang, Gyeonggi-do (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 32 days.

(21) Appl. No.: 17/808,773

(22) Filed: Jun. 24, 2022

(65) Prior Publication Data

US 2023/0131466 A1     Apr. 27, 2023

(30) Foreign Application Priority Data

Oct. 22, 2021  (KR) .................. 10-2021-0141851

(51) Int. Cl.
*G06F 3/06*       (2006.01)
*G11C 11/56*      (2006.01)
*G11C 16/04*      (2006.01)

(52) U.S. Cl.
CPC .......... *G06F 3/0616* (2013.01); *G06F 3/0635* (2013.01); *G06F 3/0644* (2013.01);
(Continued)

(58) Field of Classification Search
CPC .... G06F 3/0614; G06F 3/0616; G06F 3/0631; G06F 3/0635; G06F 3/0644;
(Continued)

(56) References Cited

U.S. PATENT DOCUMENTS 7,679,133 B2    3/2010   Son et al.
8,553,466 B2   10/2013   Han et al.
(Continued)

FOREIGN PATENT DOCUMENTS

KR    1020180031289 A    3/2018
KR    1020210057254 A    5/2021

*Primary Examiner* — Ilwoo Park
(74) *Attorney, Agent, or Firm* — Myers Bigel, P.A.

(57) ABSTRACT

A storage device includes a memory device including a first memory region, a second memory region, and a third memory region, the first memory region having a lowest bit-density relative to the second memory region and the third memory region, a second memory region having a medium bit-density relative to the first memory region and the third memory region, and a third memory region having a highest bit-density relative to the first memory region and the second memory region; and a controller configured to control the memory device The controller is configured to distribute data received from a host to the first to third memory regions based on attributes of the data, to determine a current state based on a data distribution amount for each of the first to third memory regions and a respective size of each of the first to third memory regions, and to perform an action of increasing or decreasing a size of the second memory region under the current state based on a reinforcement learning result for mitigating a reduction in lifespan of the third memory region.

20 Claims, 13 Drawing Sheets

(52) U.S. Cl.
CPC ............ *G06F 3/0679* (2013.01); *G11C 11/56* (2013.01); *G11C 16/0483* (2013.01)

(58) Field of Classification Search
CPC ..... G06F 3/0653; G06F 3/0679; G11C 11/56; G11C 16/0483
USPC .................................................. 711/103, 173
See application file for complete search history.

(56) References Cited

U.S. PATENT DOCUMENTS

| | | |
|---|---|---|
| 8,559,235 B2 | 10/2013 | Nam et al. |
| 8,654,587 B2 | 2/2014 | Yoon et al. |
| 10,008,250 B2 | 6/2018 | Ramalingam |
| 10,359,933 B2 | 7/2019 | Muchherla et al. |
| 11,061,600 B2 | 7/2021 | Deshe et al. |
| 2011/0233648 A1 | 9/2011 | Seol et al. |
| 2013/0346676 A1* | 12/2013 | Kim .................... G06F 12/0246 711/103 |
| 2018/0081594 A1 | 3/2018 | Jung et al. |
| 2018/0129440 A1 | 5/2018 | Bandic et al. |
| 2019/0095116 A1* | 3/2019 | Igahara ............... G06F 12/0246 |
| 2019/0102083 A1 | 4/2019 | Dusija et al. |
| 2019/0377508 A1* | 12/2019 | Bahar .................. G06F 3/0632 |
| 2021/0011862 A1* | 1/2021 | Chiu .................... G06F 13/1694 |
| 2021/0073119 A1* | 3/2021 | Amaki .................. G06F 3/0613 |
| 2021/0132832 A1 | 5/2021 | So et al. |
| 2021/0141553 A1 | 5/2021 | Yoo et al. |
| 2021/0173731 A1 | 6/2021 | Sarkar et al. |
| 2021/0191858 A1 | 6/2021 | Li et al. |

* cited by examiner

400

| Q-table | Action | |
|---|---|---|
| | [1] (Second region size −) | [2] (Second region size +) |
| State [1] | 0.36 | 1.04 |
| State [2] | ... | ... |
| State [3] | ... | ... |
| ... | ... | ... |
| State [972] | ... | ... |

| Q-table | | Action | | |
|---|---|---|---|---|
| | | [1] (Second region size −) | [2] (Second region size maintain) | [3] (Second region size +) |
| State | [1] | ... | ... | ... |
| | [2] | ... | ... | ... |
| | [3] | ... | ... | ... |
| | ... | ... | ... | ... |
| | [972] | ... | ... | ... |

STORAGE DEVICE AND OPERATION METHOD THEREOF

CROSS-REFERENCE TO RELATED APPLICATION(S)

This application claims benefit of priority to Korean Patent Application No. 10-2021-0141851 filed on Oct. 22, 2021 in the Korean Intellectual Property Office, the disclosure of which is incorporated herein by reference in its entirety.

BACKGROUND

The present inventive concept relates to a storage device and a method of operating the same.

A computer system may include various types of memory systems, and such memory systems may include a memory device and a controller. The memory device may be used to store data, and may be categorized as a volatile memory device or a non-volatile memory device. The memory device may include first and second memory regions having different degrees of performance, and in some examples, a write speed to the first memory region may be different from a write speed to the second memory region.

SUMMARY

An aspect of the present inventive concept is to provide a storage device configured to improve a lifespan of a memory device including memory regions having different bit-densities, and a method of operating the same.

According to an aspect of the present inventive concept, a storage device includes a memory device including a first memory region having, a second memory region, and a third memory region, the first memory region having a lowest bit-density relative to the second memory region and the third memory region, the second memory region having a medium bit-density relative to the first memory region and the third memory region, and the third memory region having a highest bit-density relative to the first memory region and the second memory region; and a controller configured to control the memory device, wherein the controller is configured to distribute data received from a host to the first to third memory regions based on attributes of the data, to determine a current state based on a data distribution amount for each of the first to third memory regions and a respective size of each of the first to third memory regions, and to perform an action of increasing or decreasing a size of the second memory region under the current state, based on a reinforcement learning result for mitigating a reduction in lifespan of the third memory region.

According to an aspect of the present inventive concept, a storage device includes a memory device including a first memory region, a second memory region, and a third memory region, the first memory region having a lowest bit-density relative to the second memory region and the third memory region, the second memory region having a medium bit-density relative to the first memory region and the third memory region, and a third memory region having a highest bit-density relative to the first memory region and the second memory region; and a controller configured to control the memory device, wherein the controller is configured to distribute data received from a host to the first to third memory regions based on attributes of the data, and to repeatedly operations as follows over a plurality of cycles to generate a reinforcement learning result: an action of increasing or decreasing a size of the second memory region under a current state determined based on a data distribution amount for each of the first to third memory regions and a respective size of each of the first to third memory regions, collecting wear level information of the memory device after the action of increasing or decreasing the size of the second memory region, determining a reward based on the wear level information, and an operation of determining the reward for an action performed under the current state.

According to an aspect of the present inventive concept, a method of operating a storage device including memory regions having different bit-densities, include determining a current state based on a data distribution amount for each of the memory regions and a size of each of the memory regions; performing an action of increasing or decreasing a size of one or more of the memory regions based on the current state; determining a reward based on a wear level of the storage device determined for the action; generating a reinforcement learning result using the current state, the action, and the reward; and adjusting a size of one or more of the memory regions using the reinforcement learning result.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
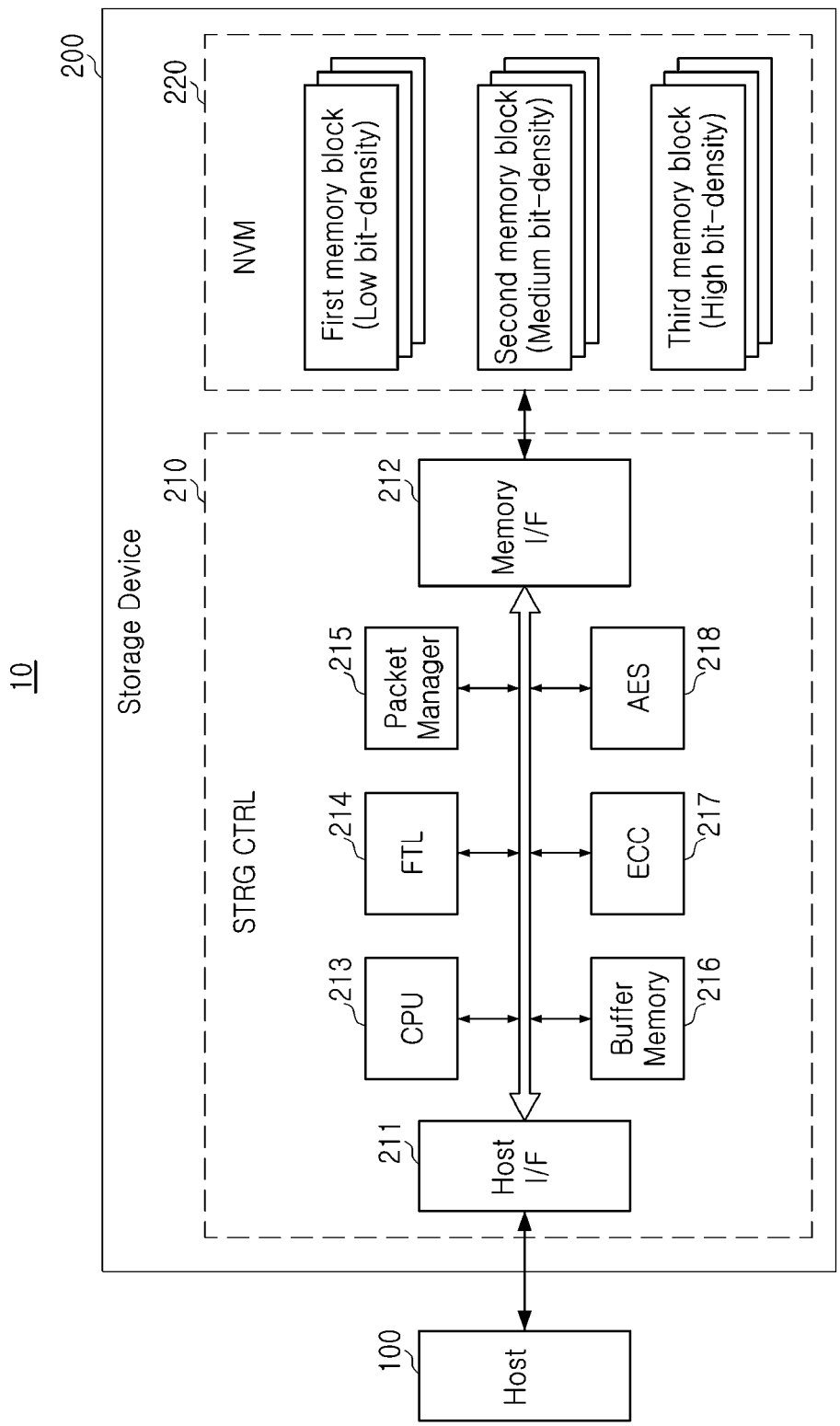
FIG. 1 is a block diagram illustrating a host-storage system according to an example embodiment of the present inventive concept.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

FIG. 1 is a block diagram illustrating a host-storage system according to an example embodiment of the present inventive concept.

A host-storage system 10 may include a host 100 and a storage device 200. Also, the storage device 200 may include a storage controller 210 and a non-volatile memory (NVM) 220.

The host 100 may include electronic devices, for example, portable electronic devices, such as mobile phones, MP3 players, laptop computers, and the like, or electronic devices, such as desktop computers, game consoles, TVs, projectors, and the like. The host 100 may include at least one operating system (OS). The operating system may overall manage and control functions and operations of the host 100.

The storage device 200 may include storage media for storing data according to a request from the host 100. As an example, the storage device 200 may include a solid state drive (SSD), an embedded memory, and/or a removable external memory. When the storage device 200 is an SSD, the storage device 200 may be a device conforming to a non-volatile memory express (NVMe) standard. When the storage device 200 is an embedded memory or an external memory, the storage device 200 may be a device conforming to a universal flash storage (UFS) standard or an embedded multi-media card (eMMC) standard. The host 100 and the storage device 200 may generate and transmit a packet according to an adopted standard protocol, respectively.

The non-volatile memory 220 may maintain stored data even when power is not supplied. The non-volatile memory 220 may store data provided from the host 100 in a programming operation, and may output the data stored in the non-volatile memory 220 in a read operation. The non-volatile memory 220 may include a plurality of memory blocks, each of which may include a plurality of pages, and each of the pages may include a plurality of memory cells connected to a word line. In an embodiment, the non-volatile memory 220 may be a flash memory.

When the non-volatile memory 220 of the storage device 200 includes a flash memory, the flash memory may include a 2D NAND memory array or a 3D (or a vertical) NAND (VNAND) memory array. As another example, the storage device 200 may include various other types of non-volatile memories. For example, in the storage device 200, a magnetic RAM (MRAM), a spin-transfer torque MRAM, a conductive bridging RAM (CBRAM), a ferroelectric RAM (FeRAM), a phase RAM (PRAM), a resistive memory, and various other types of memory may be applied.

The non-volatile memory 220 may include first to third memory blocks or regions having different bit-densities with respect to one another. A bit-density of a memory block may refer to the number of data bits that a memory cell included in the memory block stores. In the embodiment of FIG. 1, the first memory blocks may have a lowest bit-density relative to the second and third memory blocks, the third memory blocks may have a highest bit-density relative to the first and second memory block, and the second memory blocks may have a medium bit-density relative to the first and third memory blocks. For example, the number of bits that may be stored in a single memory cell may increase in the order of the first memory blocks, the second memory blocks, and the third memory blocks.

Memory blocks having different bit-densities may have different attributes. For example, the third memory blocks may provide large storage capacity in the same area, as compared to the other memory blocks. The first memory blocks may have a faster access speed and a longer lifespan, as compared to the other memory blocks. The second memory blocks may provide medium or medium-like storage capacity, medium or medium-like access speed, and medium or medium-like lifespan.

When data having different attributes may be stored separately in memory blocks having different attributes, the non-volatile memory 220 may be more efficiently used. For example, when hot data, relatively frequently accessed, is stored in the first memory blocks or region, an access speed of the hot data may be improved, and average performance of the storage device 200 may be improved. When cold data, relatively infrequently accessed, is stored in the third memory blocks or region, the data stored in the third memory blocks or region may be rarely updated, and a reduction in lifespan of the third memory blocks or region may be mitigated.

The storage controller 210 may be configured to control the non-volatile memory 220 in response to a request from the host 100. For example, the storage controller 210 may be configured to provide data read from the non-volatile memory 220 to the host 100, and may be configured to store the data provided from the host 100 in the non-volatile memory 220.

The storage controller 210 may be configured to classify data provided from the host 100 according to attributes, and may be configured to store the data separately in the first to third memory blocks. For example, the storage controller 210 may store hot data in a first memory region including the first memory blocks, may store warm data in a second memory region including the second memory blocks, and may store cold data in a third memory region including the third memory blocks.

An amount of data distributed to each of the first to third memory blocks may be changed according to a workload pattern of the host 100, and the first to third memory regions may be unevenly worn. For example, when a large amount of media data is received from the host 100, the data may be determined as cold data, and may be mainly stored in the third memory region. When data is intensively stored in the third memory region, the memory blocks of the third memory region may be worn out faster, as compared to the memory blocks of the first or second memory regions. When the memory regions are unevenly worn, a lifespan of a portion of the memory blocks or regions may expire first, and it may be difficult to normally use the storage device 200 even though lifespans of other memory blocks remain.

According to an embodiment of the present inventive concept, the storage device 200 may adjust sizes of the memory regions based on a current workload pattern to more evenly wear the memory regions. For example, when data is intensively stored in the third memory region, a size of the third memory region may increase by converting a portion of the second memory blocks into third memory blocks. When the size of the third memory region increases, a wear level of each of the third memory blocks may decrease, and the memory regions may be more evenly worn. The storage controller 210 may use a reinforcement learning model trained by setting a data distribution amount for each memory region and a size of each memory region as a current state, to adjust a size of the second memory region and a size of the third memory region, to evenly wear the memory regions.

The storage controller 210 may include a host interface 211, a memory interface 212, and a central processing unit (CPU) 213. In addition, the storage controller 210 may further include a flash translation layer (FTL) 214, a packet manager 215, a buffer memory 216, an error correction code (ECC) 217 engine, and an advanced encryption standard (AES) engine 218. The storage controller 210 may further include a working memory (not illustrated) into which the flash translation layer (FTL) 214 is loaded or embodied, and may control write and read operations of data for the non-volatile memory 220 by executing the flash translation layer 214 using the CPU 213.

The host interface 211 may be configured to transmit and receive a packet to and from the host 100. A packet transmitted from the host 100 to the host interface 211 may include a command, data to be written to the non-volatile memory 220, or the like, and a packet transmitted from the host interface 211 to the host 100 may include a response to the command, data to be read from the non-volatile memory 220, or the like.

The memory interface 212 may be configured to transmit data to be written to the non-volatile memory 220, or may be configured to receive data to be read from the non-volatile memory 220. The memory interface 212 may be implemented to comply with a standard protocol, such as a toggle or an open NAND flash interface (ONFI).

The CPU 213 may be configured to execute the flash translation layer 214. In addition, the CPU 213 may be configured to perform reinforcement learning for controlling the non-volatile memory 220, and may be configured to control the non-volatile memory 220 based on a reinforcement learning result. For example, the CPU 213 may be configured to determine a current state based on a data distribution amount for each memory region and a size of each memory region, may be configured to perform an action of increasing or decreasing a size of a memory region, and may be configured to determine a reward based on wear level information to update a reinforcement learning model. The CPU 213 may be configured to perform an action of increasing or decreasing a size of a memory region by using a learned reinforcement learning model to wear the memory region more evenly under the current state.

The flash translation layer 214 may be configured to perform various operations, such as address mapping, wear-leveling, and garbage collection. The address mapping operation may be an operation of changing a logical address received from the host 100 into a physical address used to store data in the non-volatile memory 220. The wear-leveling operation may be a technique for reducing or preventing excessive degradation of a specific block by ensuring that blocks in the non-volatile memory 220 are used uniformly, and may be implemented by, for example, a firmware technique for balancing erase counts of physical blocks. The garbage collection operation may be a technique for securing usable capacity in the non-volatile memory 220 by copying valid data of a dirty block to an erased block and then erasing the dirty block.

The packet manager 215 may be configured to generate a packet according to an interface protocol negotiated with the host 100, or may be configured to parse various types of information from a packet received from the host 100. Also, the buffer memory 216 may temporarily store data to be written to or read from the non-volatile memory 220. The buffer memory 216 may be provided in the storage controller 210 as shown in FIG. 1, but in other embodiments may be disposed outside the storage controller 210.

In addition, the buffer memory 216 may store various types of information related to the reinforcement learning. For example, the buffer memory 216 may store wear level information of the memory device, as environment information for the reinforcement learning, and may store a Q-table as a reinforcement learning result.

The ECC engine 217 may be configured to perform an error detection and a correction function on read data read from the non-volatile memory 220. More specifically, the ECC engine 217 may be configured to generate parity bits for write data to be written into the non-volatile memory 220, and the generated parity bits may be stored in the non-volatile memory 220, together with the write data. When reading data from the non-volatile memory 220, the ECC engine 217 may be configured to correct an error in read data using parity bits read from the non-volatile memory 220 together with the read data, and the error-corrected read data may be output.

The AES engine 218 may be configured to perform at least one of an encryption operation or a decryption operation on data input to the storage controller 210 using a symmetric-key algorithm.

Hereinafter, before describing the operation of the storage device 200 according to an embodiment of the present inventive concept, memory blocks having different attributes included in the non-volatile memory 220 will be described in more detail.

Figure 2:
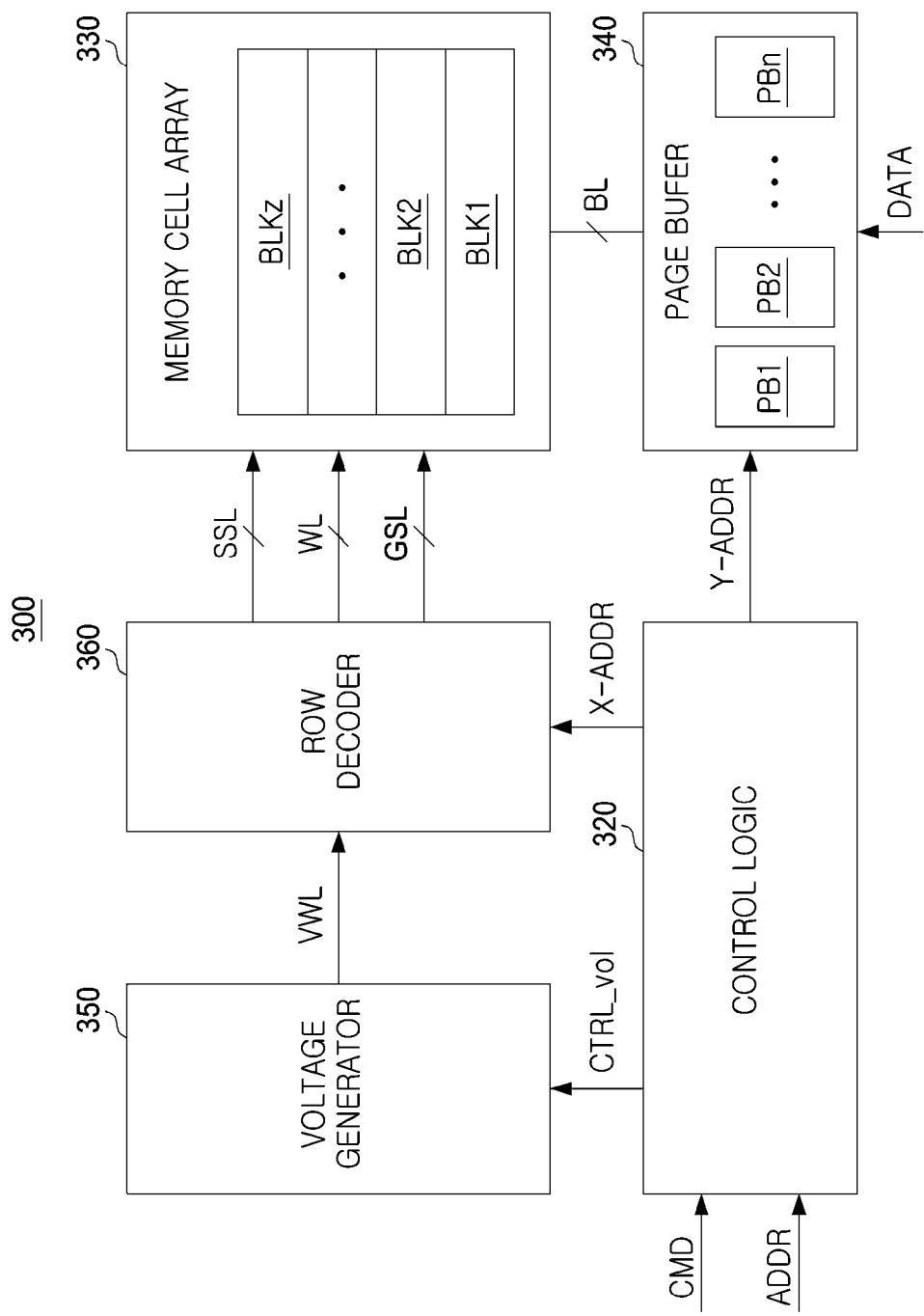
FIGS. 2 to 4 are diagrams illustrating, in greater detail, memory blocks included in a non-volatile memory.

FIG. 2 may be an example block diagram illustrating a memory device according to some embodiments of the inventive concept. Referring to FIG. 2, a memory device 300 may include a control logic circuit 320, a memory cell array 330, a page buffer 340, a voltage generator 350, and a row decoder 360. Although not illustrated in FIG. 2, the memory device 300 may further include a memory interface circuit for receiving a command CMD and an address ADDR from the outside, and exchanging data DATA externally, and also may further include a column logic, a pre-decoder, a temperature sensor, a command decoder, an address decoder, or the like.

The control logic circuit 320 may be configured to generally control various operations in the memory device 300. The control logic circuit 320 may be configured to output various control signals in response to a command CMD and/or an address ADDR from a memory interface circuit 310. For example, the control logic circuit 320 may output a voltage control signal CTRL_vol, a row address X-ADDR, and a column address Y-ADDR.

The memory cell array 330 may include a plurality of memory blocks BLK1 to BLKz (where z is a positive integer), and each of the plurality of memory blocks BLK1 to BLKz may include a plurality of memory cells. The memory cell array 330 may be connected to the page buffer 340 through bit lines BL, and may be connected to the row decoder 360 through word lines WL, string select lines SSL, and ground select lines GSL.

In an example embodiment, the memory cell array 330 may include a 3D memory cell array, and the 3D memory cell array may include a plurality of NAND strings. Each of the NAND strings may include memory cells respectively connected to word lines stacked vertically on a substrate. U.S. Pat. Nos. 7,679,133, 8,553,466, 8,654,587, 8,559,235, and U.S. Patent Publication No. 2011/0233648 describe example 3D memory cell arrays and are incorporated and combined herein by reference in their entireties. In an example embodiment, the memory cell array 330 may include a two-dimensional memory cell array, and the two-dimensional memory cell array may include a plurality of NAND strings arranged in row and column directions.

The page buffer 340 may include a plurality of page buffers PB1 to PBn (where, n is an integer greater than or equal to 3), and the plurality of page buffers PB1 to PBn may be respectively connected to memory cells through a plurality of bit lines BL. The page buffer 340 may be configured to select at least one bit line among the bit lines BL in response to the column address Y-ADDR. The page buffer 340 may be configured to operate as a write driver or a sense amplifier according to an operation mode. For example, during a programming operation, the page buffer 340 may be configured to apply a bit line voltage corresponding to data to be programmed to a selected bit line. During a read operation, the page buffer 340 may sense data stored in the memory cell by sensing a current or a voltage of the selected bit line.

The voltage generator 350 may be configured to generate various types of voltages for performing program, read, and erase operations, based on the voltage control signal CTRL_vol. For example, the voltage generator 350 may generate a programming voltage, a read voltage, a program verify voltage, an erase voltage, or the like, as a word line voltage VWL.

The row decoder 360 may be configured to select one of the plurality of word lines WL in response to the row address X-ADDR, and may be configured to select one of the plurality of string select lines SSL. For example, the row decoder 360 may be configured to apply a programming voltage and a program verify voltage to a selected word line during the programming operation, and may be configured to apply a read voltage to the selected word line during the read operation.

Figure 3:
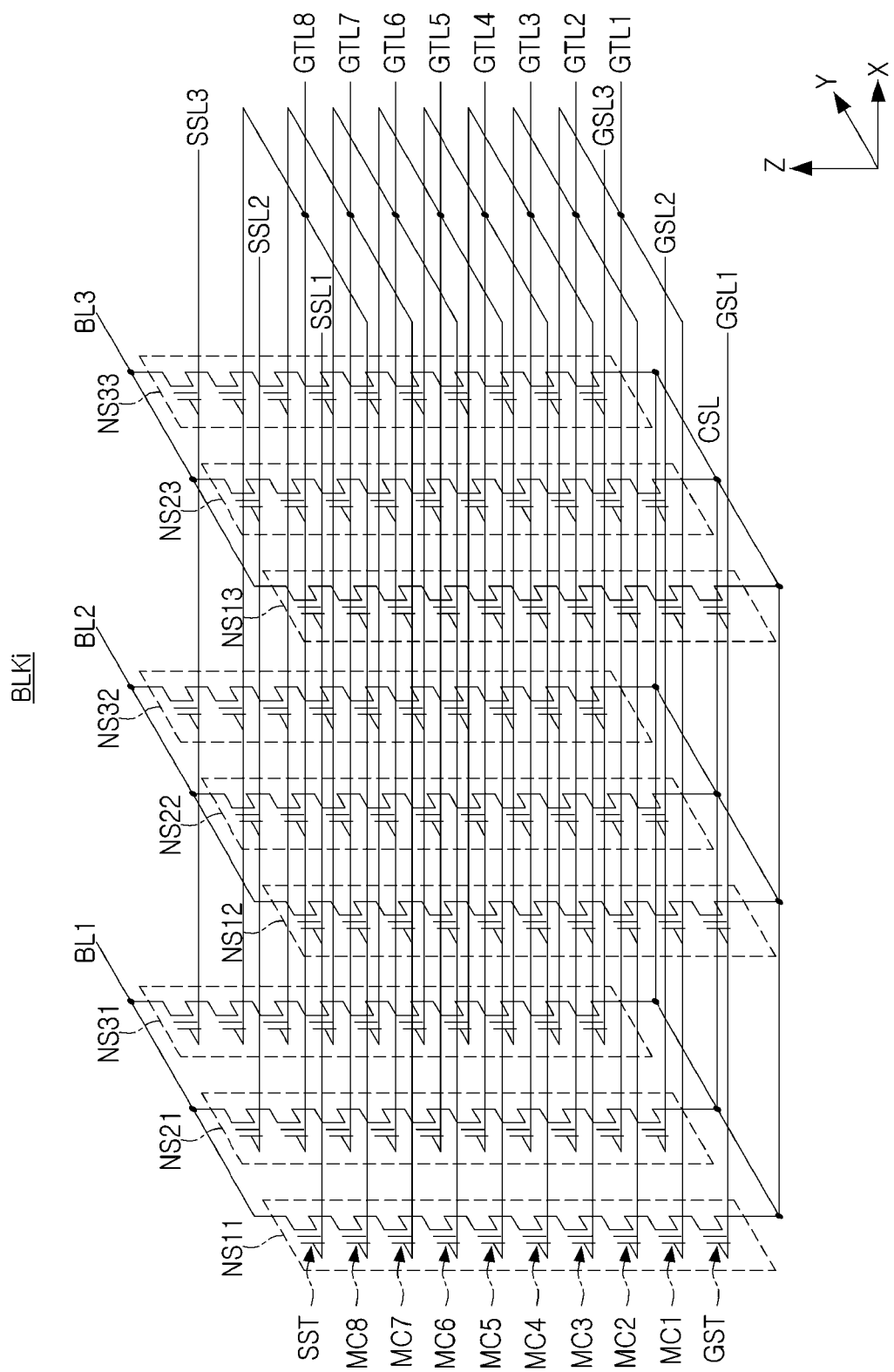

FIG. 3 is a diagram illustrating a 3D V-NAND structure applicable to a memory device according to an embodiment of the present inventive concept. When a storage module of a memory device is implemented as a 3D V-NAND type flash memory, a plurality of memory blocks constituting the storage module may be respectively represented by an equivalent circuit as illustrated in FIG. 3.

A memory block BLKi illustrated in FIG. 3 may represent a three-dimensional memory block formed on a substrate in a three-dimensional structure. For example, a plurality of memory NAND strings included in the memory block BLKi may be formed in a direction perpendicular to the substrate.

Referring to FIG. 3, the memory block BLKi may include a plurality of memory NAND strings NS11 to NS33 connected between bit lines BL1, BL2, and BL3 and a common source line CSL. Each of the plurality of memory NAND strings NS11 to NS33 may include a string select transistor SST, a plurality of memory cells MC1, MC2, . . . , MC8, and a ground select transistor GST. Although it is illustrated in FIG. 3 that each of the plurality of memory NAND strings NS11 to NS33 includes eight memory cells MC1, MC2, . . . , MC8, embodiments of the present inventive concept is not limited thereto.

The string select transistor SST may be connected to string select lines SSL1, SSL2, and SSL3 corresponding thereto. The plurality of memory cells MC1, MC2, . . . , MC8 may be respectively connected to gate lines GTL1, GTL2, . . . , GTL8 corresponding thereto. The gate lines GTL1, GTL2, . . . , GTL8 may correspond to word lines, and a portion of the gate lines GTL1, GTL2, . . . , GTL8 may correspond to dummy word lines. The ground select transistor GST may be connected to ground select lines GSL1, GSL2, and GSL3 corresponding thereto. The string select transistor SST may be connected to the bit lines BL1, BL2, and BL3 corresponding thereto, and the ground select transistor GST may be connected to the common source line CSL.

Word lines having the same height (e.g., WL1) may be commonly connected, and the ground selection lines GSL1, GSL2, and GSL3 and the string select lines SSL1, SSL2, and SSL3 may be separated from each other. In FIG. 3, the memory block BLKi is illustrated as being connected to eight gate lines GTL1, GTL2, . . . , GTL8 and three bit lines BL1, BL2, BL3, but embodiments of the present inventive concept are not necessarily limited thereto.

The memory block BLKi may have different bit-densities according to the number of bits stored by the memory cells included in the memory block BLKi.

Figure 4:
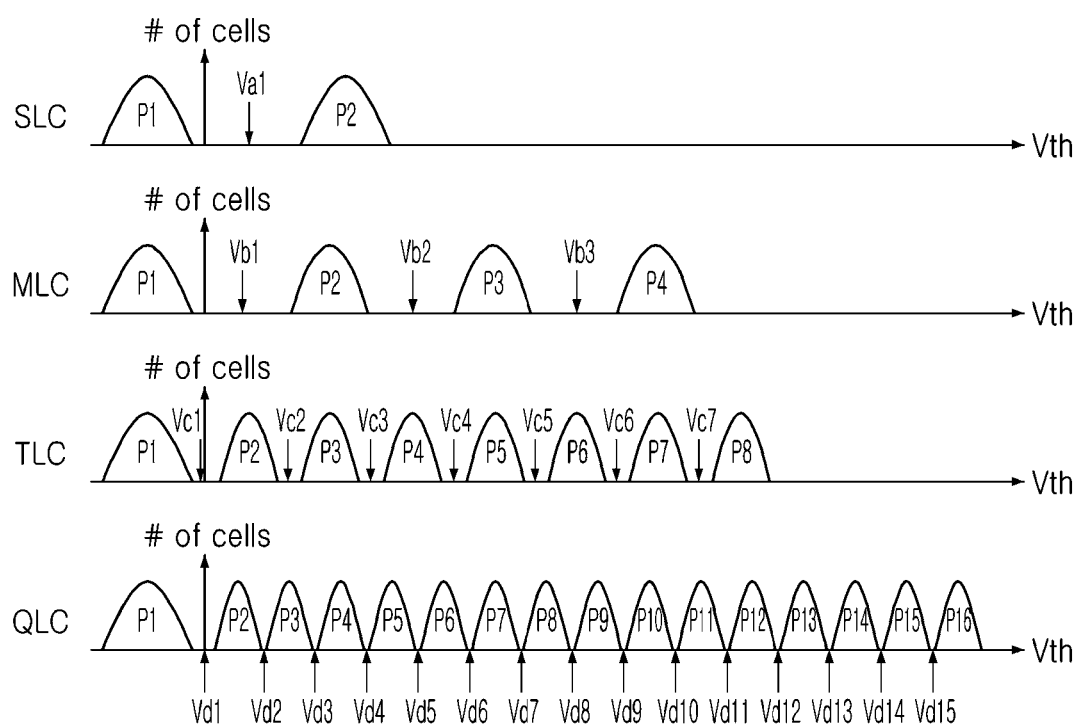

FIG. 4 is a diagram illustrating threshold voltage distributions according to the number of bits stored in a memory cell.

Referring to FIG. 4, in each graph, a horizontal axis indicates a magnitude of a threshold voltage, and a vertical axis indicates the number of memory cells.

When a memory cell is a single level cell (SLC) that stores 1-bit data, the memory cell may have a threshold voltage corresponding to any one of a first program state P1 and a second program state P2. A read voltage Va1 may be a voltage for distinguishing the first program state P1 and the second program state P2. A memory cell having the first program state P1 may have a threshold voltage, lower than the read voltage Va1, and may be thus read as an on-cell. A memory cell having the second program state P2 may have a threshold voltage, higher than the read voltage Va1, and may be thus read as an off-cell.

When a memory cell is a multiple level cell (MLC) that stores 2-bit data, the memory cell may have a threshold voltage corresponding to any one of first to fourth program states P1 to P4. First to third read voltages Vb1 to Vb3 may be read voltages for distinguishing each of the first to fourth program states P1 to P4. The first read voltage Vb1 may be a read voltage for distinguishing the first program state P1 and the second program state P2. The second read voltage Vb2 may be a read voltage for distinguishing the second program state P2 and the third program state P3. The third read voltage Vb3 may be a read voltage for distinguishing the third program state P3 and the fourth program state P4.

When a memory cell is a triple level cell (TLC) that stores 3-bit data, the memory cell may have a threshold voltage corresponding to any one of first to eighth program states P1 to P8. First to seventh read voltages Vc1 to Vc7 may be read voltages for distinguishing each of the first to eighth program states P1 to P8. The first read voltage Vc1 may be a read voltage for distinguishing the first program state P1 and the second program state P2. The second read voltage Vc2 may be a read voltage for distinguishing the second program state P2 and the third program state P3. In the same manner, the seventh read voltage Vc7 may be a read voltage for distinguishing the seventh program state P7 and the eighth program state P8.

When a memory cell is a quadruple level cell (QLC) that stores 4-bit data, the memory cell may have a threshold voltage corresponding to any one of first to sixteenth program states P1 to P16. First to fifteenth read voltages Vd1 to Vd15 may be read voltages for distinguishing each of the first to sixteenth program states P1 to P16. The first read voltage Vd1 may be a read voltage for distinguishing the first program state P1 and the second program state P2. The second read voltage Vd2 may be a read voltage for distinguishing the second program state P2 and the third program state P3. In the same manner, the fifteenth read voltage Vd15 may be a read voltage for distinguishing the fifteenth program state P15 and the sixteenth program state P16.

As a memory block has a higher bit-density, the number of program states formed in memory cells of the memory block, and the number of read voltages for distinguishing the program states may increase. Therefore, as a bit-density increases, a programming operation time period for forming each of the program states may increase and a read operation time period for distinguishing the program states may increase to lower an access speed thereof.

When program and erase operations are repeated in the memory block, the memory cells may be deteriorated. When the memory cells are deteriorated, it may be difficult to precisely program each of the program states of the memory cells. In a memory block having a higher bit-density, a program state thereof may have to be programmed more precisely. Therefore, lifespans of memory blocks with higher bit-densities may expire with fewer erase counts.

When a storage device can classify and store data in memory regions having different bit-densities based on attributes of the data, access performance and a lifespan of the storage device may be improved. An amount of data distributed to each of the memory regions may be changed according to a host workload pattern. When an amount of data distributed to each of the memory regions is changed, each of the memory regions may be unevenly worn. When the memory regions are worn more evenly despite the change in the host workload pattern, the lifespan of the storage device may be improved.

According to an embodiment of the present inventive concept, a storage device may perform reinforcement learning to increase or decrease sizes of memory regions to more evenly wear the memory regions. Specifically, the storage device may be configured to distribute data received from a host into memory regions having different bit-densities, may be configured to generate a current state based on a data distribution amount for each memory region and a size of each memory region, may be configured to perform an action to increase or decrease a size of at least a portion of the memory region, may be configured to collect wear level information of a non-volatile memory after performing the action, and may add a high reward when the memory regions are more evenly worn to generate a reinforcement learning result. In addition, the storage device may be configured to dynamically increase or decrease the sizes of the memory regions based on the reinforcement learning result.

Hereinafter, a storage device and an operating method thereof according to an example embodiment of the present inventive concept will be described in detail with reference to FIGS. 5 to 14.

Figure 5:
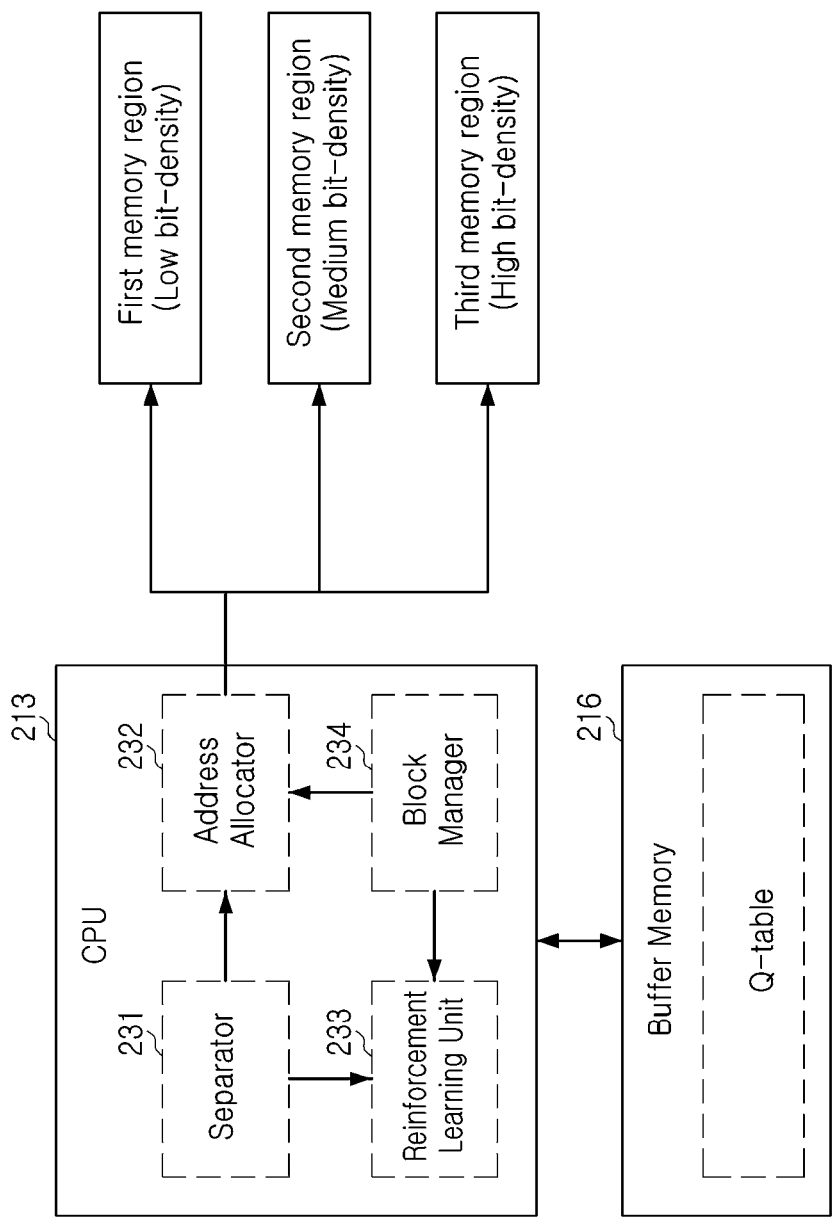
FIG. 5 is a block diagram illustrating some configurations of the storage device described with reference to FIG. 1.

FIG. 5 is a view illustrating some configurations of a storage device 200, as described with reference to FIG. 1. For example, a CPU 213 and a buffer memory 216 of FIG. 5 may correspond to those described with reference to FIG. 1. In addition, a first memory region of FIG. 5 may include the first memory blocks of FIG. 1, a second memory region of FIG. 5 may include the second memory blocks of FIG. 1, and a third memory region of FIG. 5 may include the third memory blocks of FIG. 1.

The first memory region may be a memory region having a lowest bit-density relative to the second and third memory regions, the second memory region may be a memory region having a medium bit-density relative to the first and third memory regions, and the third memory region may be a memory region having a highest bit-density relative to the first and second memory regions. For example, the first memory region may include SLC memory blocks, the second memory region may include TLC memory blocks, and the third memory region may include QLC memory blocks, but embodiments of the present inventive concept are not limited thereto.

The CPU 213 may be configured to drive or execute a separator 231, an address allocator 232, a reinforcement learning unit 233, and a block manager 234. The separator 231, the address allocator 232, the reinforcement learning unit 233, and the block manager 234 may be loaded into a working memory (not illustrated), and may be driven or executed by the CPU 213. For example, the separator 231, the address allocator 232, the reinforcement learning unit 233, and the block manager 234 may be included in a flash translation layer 214, as described with reference to FIG. 1.

The separator 231 may be configured to determine an attribute of data received from a host 100 and may be configured to determine in which memory region among the first to third memory regions the data will be stored. For example, the separator 231 may be configured to determine hotness of the data received from the host 100, and may be configured to determine whether the data is hot data, warm data, or cold data based on the hotness. For example, the separator 231 may be configured to determine data having a degree of hotness higher than a first threshold value as the hot data, may be configured to determine data having a degree of hotness between the first threshold value and a second threshold value as the warm data, and may be configured to determine data having a degree of hotness lower than the second threshold value as the cold data.

The address allocator 232 may map a logical address received from the host 100 to a physical address of a non-volatile memory 220. For example, the logical address may be a logical block address (LBA) used in a file system of the host 100. The address allocator 232 may be configured to perform address mapping to store the data classified as hot data by the separator 231 in the first memory block, may be configured to store the data classified as warm data in the second memory block, and may be configured to store the data classified as cold data in the third memory block.

The reinforcement learning unit 233 may be configured to perform reinforcement learning based on environment information of the storage device 200 to generate a reinforcement learning result.

The reinforcement learning may be described with concepts of an agent, an action, an environment, a state, and a reward. Here, reinforcement learning may be a learning method in which an agent defined in an environment recognizes a current state and selects an action that maximizes a reward among selectable actions.

According to an embodiment of the present inventive concept, the reinforcement learning unit 233 may be configured to perform an action of increasing or decreasing a size of the second memory region as an agent under a current state. In addition, the reinforcement learning unit 233 may collect environmental information, for example, wear level information of memory blocks according to the action. The reinforcement learning unit 233 may be configured to determine a reward for the action performed in the current state based on a change in environmental information. The reinforcement learning unit 233 may be configured to perform an action under a current state and determine a reward for the action, repeatedly, to generate a reinforcement learning result.

The block manager 234 may be configured to manage memory blocks included in the non-volatile memory 220. Specifically, the block manager 234 may be configured to change bit-densities of memory blocks based on the reinforcement learning result learned by the reinforcement learning unit 233 to change sizes of the memory regions. For example, the block manager 234 may be configured to convert one or more of the second memory blocks into one or more third memory blocks to change a bit-density of the one or more second memory blocks, The memory blocks with the changed bit-density may be moved into the third memory region to decrease a size of the second memory region and increase a size of the third memory region.

In addition, the block manager 234 may be configured to perform an erase count of memory blocks to manage lifespans of the memory blocks. Also, when a memory block that cannot be accessed normally is detected, the block manager 234 may determine the memory block as a bad block and may prevent data from being programmed into the bad block.

The buffer memory 216 may be configured to store the generated reinforcement learning result. For example, the buffer memory 216 may store a Q-table indicating a degree of a reward according to selectable actions for all possible states of the storage device as the reinforcement learning result.

The CPU 213 may be configured to perform a reinforcement learning-based operation with reference to the Q-table stored in the buffer memory 216. For example, the block manager 234 may be configured to determine a size of each of the memory regions with reference to the Q-table, such that the lifespans of the memory regions are more evenly reduced under the current state. In addition, the block manager 234 may be configured to change the bit-densities of the memory blocks to change the size of the memory region.

Figure 6A:
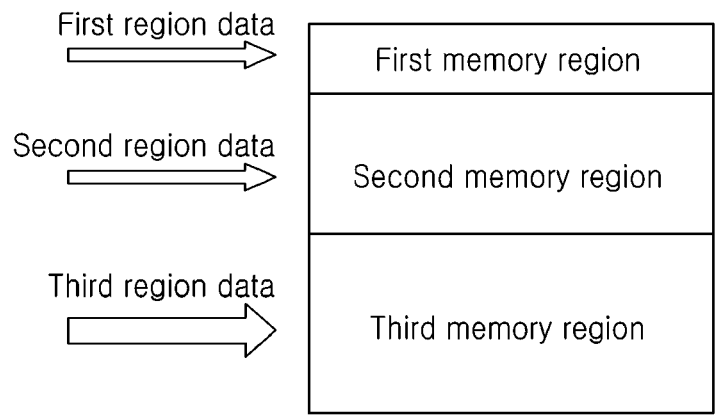
FIGS. 6A and 6B are diagrams illustrating a reduction in lifespan of memory regions according to a current state of a storage device.
Figure 6B:
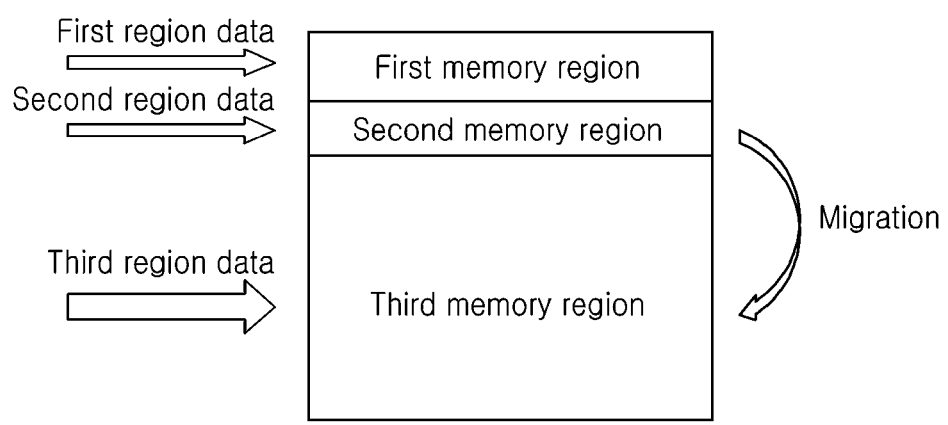

FIGS. 6A and 6B are diagrams illustrating a reduction in lifespan of memory regions according to a current state of a storage device.

FIGS. 6A and 6B illustrate first to third memory regions, as described with reference to FIG. 5. As described with reference to FIG. 5, data having different attributes may be separately stored in the first to third memory regions. Data received from a host may be distributed to the first to third memory regions under control of a storage controller. The data distributed to the first to third memory regions may be referred to as first region data, second region data, and third region data, respectively. For example, the first region data may be hot data, the second region data may be warm data, and the third region data may be cold data.

The first to third memory regions may have different sizes. For example, the third memory region having the highest bit-density may have the largest size to provide a large storage capacity to the host. In addition, the first and second memory regions, having sizes, smaller than that of the third memory region, may supplement an access speed of the third memory region. When free spaces of first and second memory regions become insufficient, first and second region data may be migrated to the third memory region to secure free space.

Depending on a data distribution amount for each memory region and a size of each memory region, a wear level for each memory region may be changed. According to an embodiment of the present inventive concept, a storage device may perform reinforcement learning to provide a higher reward as the third memory region is less worn as a result of performing an action of increasing or decreasing a size of one or more of the memory regions under a current state.

FIGS. 6A and 6B illustrate a wear level for each memory region by taking as an example a case in which most of the data received from a host is provided to a third memory region according to a workload pattern from the host. In FIGS. 6A to 6B, arrows having different thicknesses indicate relative amounts of first to third region data received from the host.

FIG. 6A illustrates a case in which a size of a second memory region is similar to a size of a third memory region. A larger amount of data may be programmed in the third memory region compared to the second memory region. In the third memory region, to program a large amount of data in a limited memory region, multiple erase operations may be performed to secure free space, and, as a result, the third memory region may be significantly worn as compared to the second memory region.

FIG. 6B illustrates a case in which a size of a second memory region is too small to program a small amount of second region data. When free space of the second memory region is insufficient, the second region data may be moved to the third memory region to secure the free space of the second memory region, and an erase operation may be performed on the second memory region. Therefore, when the size of the second memory region is excessively small, a wear level of the second memory region may increase, and a wear level of the third memory region may also increase due to the data moved from the second memory region.

For example, when the storage device performs reinforcement learning, such that the third memory region is less worn, and a size of the memory region increases or decreases based on a reinforcement learning result, the memory regions may be worn more evenly, and an overall wear level of the memory regions may increase in a small amount. Therefore, a lifespan of the storage device may be improved.

FIGS. 7 to 10 are diagrams illustrating a method of operating a storage device according to an embodiment of the present inventive concept.

Figure 7:
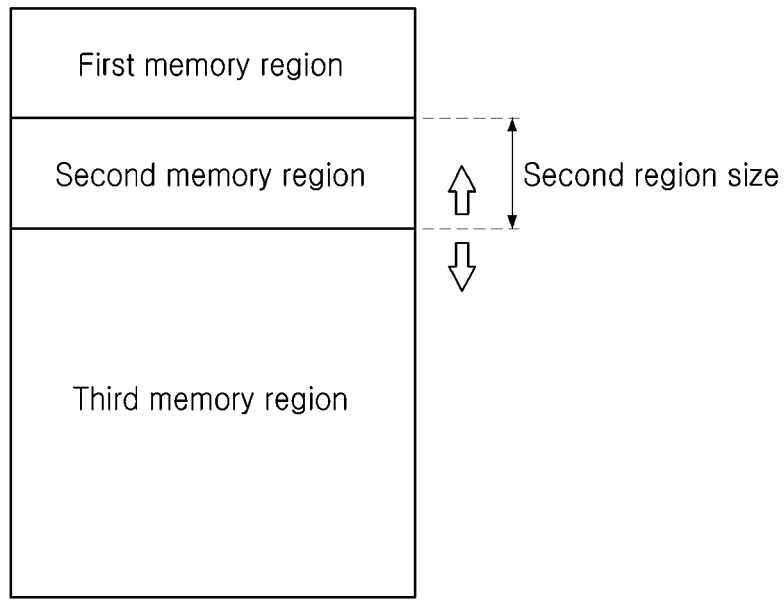
FIG. 7 is a diagram illustrating an operation of changing a size of a memory region in a storage device.

FIG. 7 is a diagram illustrating an operation of a storage device changing a size of a memory region.

Referring to FIG. 7, a storage device may increase or decrease a size of a second memory region. For example, the storage device may convert a second memory block into a third memory block, to decrease a size of a second memory region and increase a size of a third memory region. Specifically, a storage controller may select a memory block in which data is not stored among second memory blocks, and may change an address mapping rule of the memory block. In addition, the storage controller may control a memory device to change the number of programming voltages applied to a memory block corresponding thereto. Similarly, the storage device may convert the third memory block into the second memory block to increase the size of the second memory region and decrease the size of the third memory region.

According to an embodiment of the present inventive concept, the storage device may increase a lifespan of the storage device by increasing or decreasing the size of the second memory region based on a reinforcement learning result performed in a manner in which the third memory region is less worn.

In the embodiment of FIG. 7, a case in which the size of the second region and the size of the third memory region are adjusted by performing switching between the second memory block and the third memory block has been described as an example, but embodiments of the present inventive concept are not limited thereto. For example, the storage device may use one memory block as any one of the first to third memory blocks, and may adjust any of the sizes of the first to third memory regions.

Figure 8:
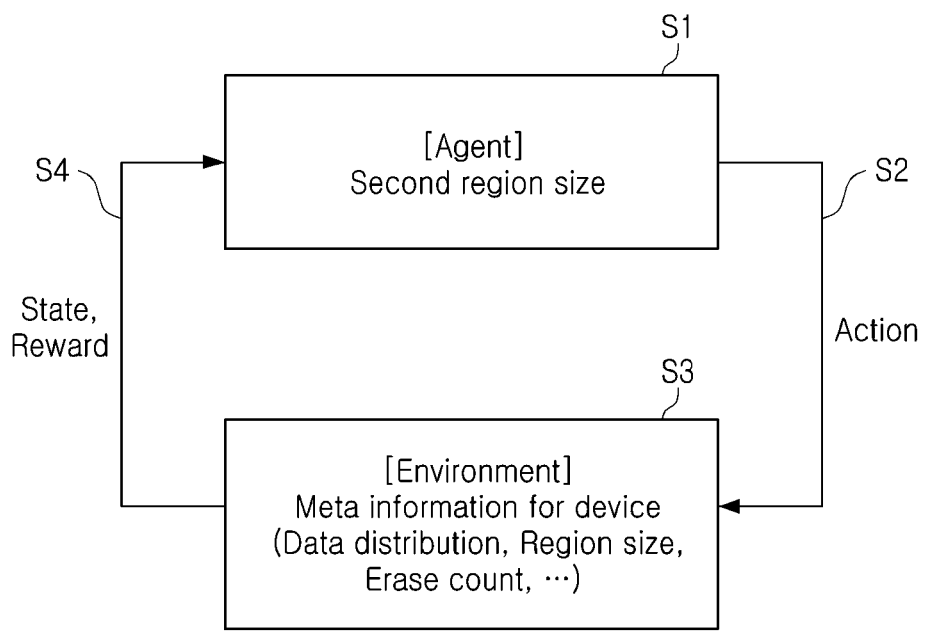
FIG. 8 is a diagram illustrating a method in which a storage device performs reinforcement learning.

FIG. 8 is a diagram illustrating a method in which a storage device performs reinforcement learning.

Referring to FIG. 8, in S1 and S2, a storage device may perform an action for a second region size, as an agent, under a current state.

The current state may be determined according to a data distribution amount for each memory region and a size of each memory region. And, the action may be an operation of increasing or decreasing a size of a second memory region. Specifically, the action may include converting a second memory block into a third memory block or converting a third memory block into a second memory block.

In S3, the storage device may collect environmental information for the storage device after performing the action. The environment information may include a data distribution amount for each memory region, a size of each memory region, an erase count of memory blocks, or the like.

The storage device may determine a reward of a current cycle based on the environment information and may determine a state of the next cycle in S4.

Reinforcement learning may be performed over a plurality of cycles, and environmental information may be collected for each unit cycle. For example, the environment information may be collected whenever a predetermined amount of data is received from a host, or may be collected whenever a predetermined time elapses.

A storage device may generate wear level information in a current period of a memory device based on an erase count of a memory block, and may determine a reward based on the wear level information. According to an embodiment of the present inventive concept, a storage device may determine wear level information based on an increment in erase count in a unit period of memory blocks included in a third memory region. Because a limited erase count until the end of lifespans of third memory blocks may be different, a value obtained by dividing an increment in erase count of the third memory block by the limited erase count may be used as standardized wear level information. The storage device may determine a reward to have a higher value, as a value of the wear level information is lower, e.g., as the third memory region wears less in a unit period.

The storage device may determine a state of the next cycle based on a data distribution amount for each memory region and a size of each memory region.

Reinforcement learning may be performed over a plurality of cycles, and operations of S1 to S4 may be performed for each unit cycle. For example, the operations of S1 to S4 may be performed whenever a predetermined amount of data is received from a host or may be performed whenever a predetermined time elapses.

Figure 9:
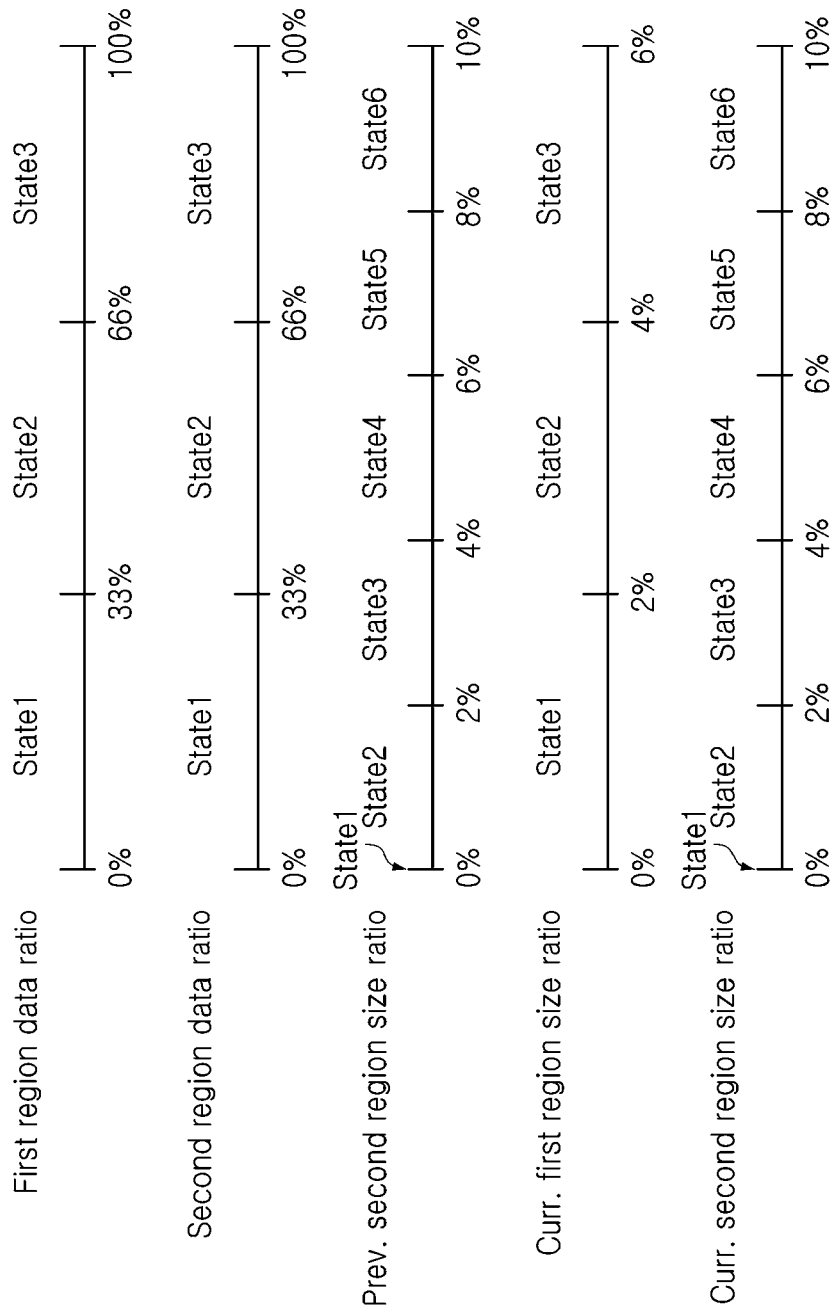
FIG. 9 is a diagram illustrating in detail a method for a storage device to determine a state.

FIG. 9 is a diagram illustrating in detail a method for a storage device to determine a state.

The number of states that a storage device may have may be determined according to factors collected as environmental information and the number of states defined in each of the factors. In an embodiment of FIG. 9, a storage device may determine five factors based on environment information. Specifically, the storage device may determine a first region data ratio, a second region data ratio, a previous second region size ratio, a current first region size ratio, and a current second region size ratio.

The first region data ratio may represent a ratio of an amount of data distributed to a first memory region to a total amount of data received from a host in a unit period, and the second region data ratio may represent a ratio of an amount of data distributed to a second memory region to the total amount of data received from the host in a unit period. The first region data ratio and the second region data ratio may be changed according to a host workload pattern.

The current first region size ratio may represent a ratio of a size of the first memory region to overall storage capacity of a non-volatile memory in a current period, and the current second region size ratio may represent a ratio of a size of the second memory region to the overall storage capacity of the non-volatile memory in a current period. The previous second region size ratio may represent a ratio of a size of the second memory region to the overall storage capacity of the non-volatile memory in a previous period.

Even when the storage device changes only a second region size and a third region size, based on reinforcement learning, a first region size ratio may be changed. For example, when a second memory block is converted into a third memory block or the third memory block is converted into the second memory block, storage capacity of memory blocks may be changed, and thus overall capacity of memory regions may be changed. Therefore, even when the first region size is fixed, the first region size ratio may be changed. As another example, when a bad block occurs among first memory blocks, the first region size may decrease, and as a result, the first region size ratio may be changed.

The storage device may classify a plurality of states for each factor. In the embodiment of FIG. 9, the first region data ratio, the second region data ratio, the previous second region size ratio, the current first region size ratio, and the current second region size ratio may be divided into 3, 3, 6, 3, and 6, respectively.

As a specific example, when a ratio of data distributed to a first region among data provided from the host in a current period, e.g., the first region data ratio is 0% to 33%, the first region data ratio may have a state of 'State1.' And, when the data ratio of the first region is 33% to 66%, the first region data ratio may have a state of 'State2,' and when the data ratio of the first region is 66% to 100%, the first region data ratio may have a state of 'State3.'

As another example, when the second memory region is not allocated to the storage device at all in a current period, e.g., when a ratio of the second memory region size to the total memory region size is 0%, the current second memory region size ratio (curr. second region size ratio) may have a state of 'State1.' When the ratio of the second memory region size is greater than 0% and less than 2%, the current second memory region size ratio may have a state of 'State2.' When the ratio of the second memory region size is 8% to 10%, the current second memory region size ratio may have a state of 'State6.' in the embodiment of FIG. 9, the storage device may set the second memory region size such that the second memory region size is within 10% of the total memory region, and when the second memory region size rate is greater than 10%, a status value may not be allocated. However, embodiments of the present inventive concept are not limited thereto.

Figures 10, 11:
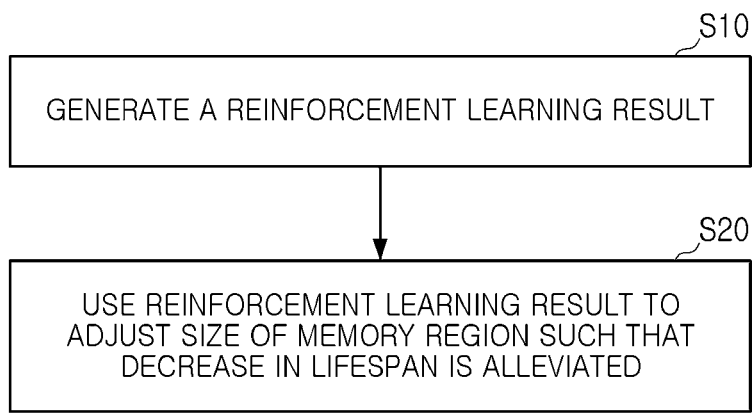
FIG. 10 illustrates a Q-table according to an embodiment of the present inventive concept.
FIGS. 11 to 13 are flowcharts illustrating a method of operating a storage device according to an embodiment of the present inventive concept.

As illustrated in FIG. 10, a Q-table may include a plurality of states defined in reinforcement learning.

When the Q-table 400 of FIG. 10 is described according to the embodiment of FIG. 9, the number of states stored in the Q-table may be 972 (=3*3*6*3*6). For example, the total number of states to which the storage device may belong may be 972.

The Q-table may store a size of a reward according to an action for the plurality of states. The Q-table may be determined by a Q-learning equation. The Q-learning equation may be a reinforcement learning technique for learning without a model, and may be a function that predicts an expected utility value of performing a given action in a given state. According to an embodiment of the present inventive concept, as a wear level of a third memory region decreases due to an action of increasing or decreasing a size of a second memory region performed under a current state, a higher reward value will be given by the Q-learning equation. For example, in a state [1], a reward value of an action [1] of decreasing the size of the second memory region may be determined to be 0.36, and a reward value of an action [2] of increasing the size of the second memory region may be determined to be 1.04. When the current state is the state [1], the storage device may perform the action [2] with a larger reward value with reference to the Q-table, such that the wear level of the third memory region increases little, and the possibility in which the memory regions are worn more evenly increases.

Figure 12:
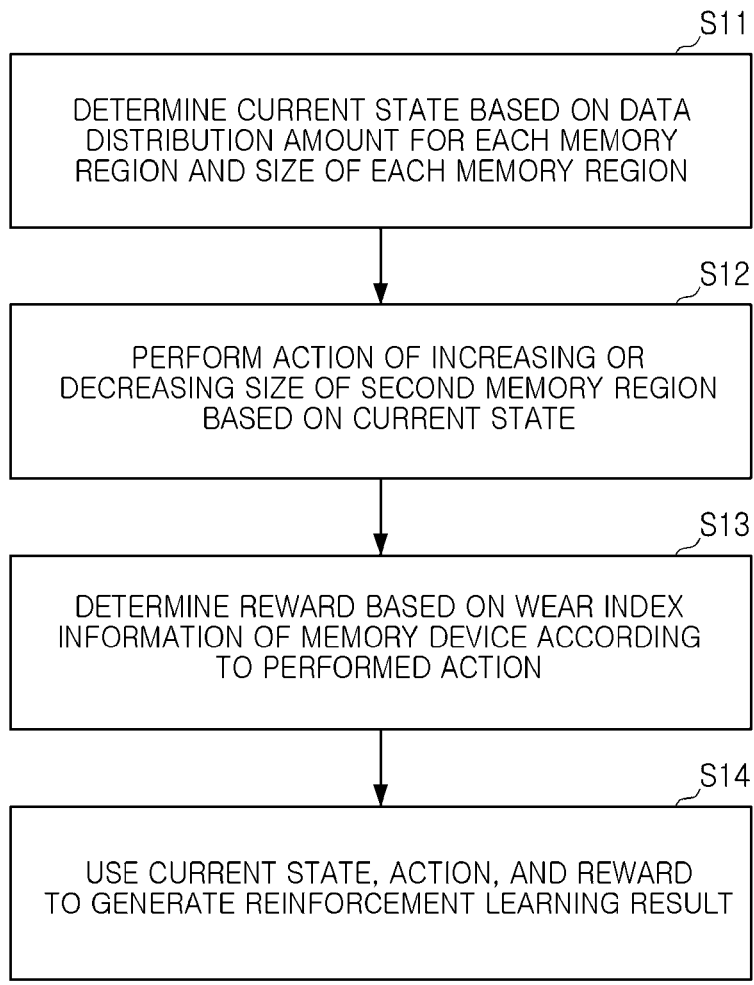
Figures 13, 14:
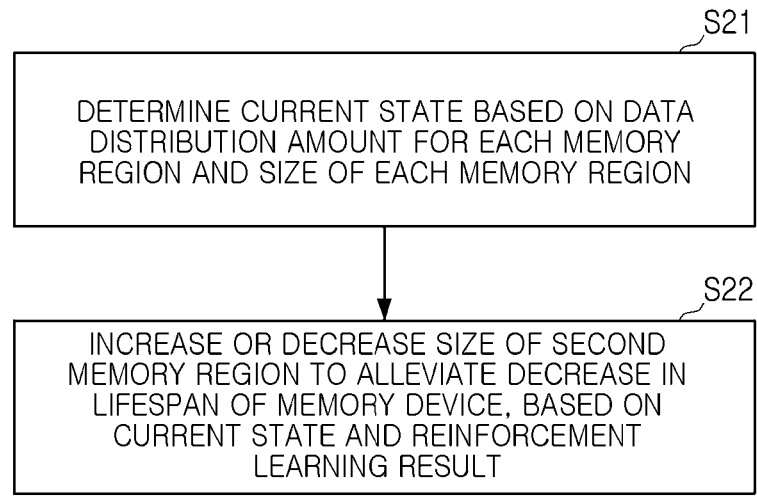
FIG. 14 illustrates a Q-table according to a further embodiment of the present inventive concept.

FIGS. 11 to 13 are flowcharts illustrating a method of operating a storage device according to an embodiment of the present inventive concept.

Referring to FIG. 11, in S10, a storage device may repeatedly perform an action under a current state and may determine a reward according to a result of the action to generate a reinforcement learning result. An operation of S10 may be performed during a collection period of the storage device. The collection period may refer to a period for collecting environmental information determined according to actual usage of a user at an initial stage of use of the storage device to improve or optimize the performance of the storage device.

In S20, the storage device may use the generated reinforcement learning result to adjust a size of the memory region such that a decrease in lifespan of the storage device is mitigated or alleviated.

FIG. 12 illustrates detailed operations included in S10 of FIG. 11 according to some embodiments of the inventive concept.

In S11, the storage device may determine a current state based on a data distribution amount for each memory region and a size of each memory region. An example of how the storage device determines the current state has been described in detail with reference to FIG. 9.

In S12, the storage device may perform an action of increasing or decreasing a size of a second memory region based on the current state. An example of how the storage device increases or decreases the size of the second memory region has been described in detail with reference to FIG. 7.

In S13, the storage device may determine a reward based on wear level information of a non-volatile memory according to the performed action. According to an embodiment of the present inventive concept, as a third memory region is worn less in a unit period, the storage device may determine a larger value for the reward for the action performed under the current state.

In S14, the storage device may use the current state, the action, and the reward to generate a reinforcement learning result. For example, the storage device may perform reinforcement learning over a plurality of cycles and may collect a plurality of values of state, action, and reward information to generate a Q-table as described with reference to FIG. 10. In some embodiments, the Q-table may be stored in the non-volatile memory, and may be loaded into a buffer memory for reference during an operation of the storage device.

FIG. 13 illustrates detailed operations included in S20 of FIG. 11 according to some embodiments of the inventive concept.

In S21, the storage device may determine a current state based on a data distribution amount for each memory region and a size of each memory region.

In S22, the storage device may increase or decrease the size of the second memory region to mitigate or alleviate a decrease in lifespan of the memory device based on the current state and the reinforcement learning result. For example, the storage device may select an action having a highest reward value under the current state with reference to the Q-table loaded into the buffer memory.

According to an embodiment of the present inventive concept, the operations of S21 and S22 may be performed periodically. The storage device may dynamically adjust sizes of the memory regions using reinforcement learning, such that the memory regions are more evenly worn, despite a change in host workload pattern. Therefore, a lifespan of the storage device may be improved.

As described with reference to FIGS. 9 to 13, the storage device may perform any one of two actions of increasing or decreasing the size of the second memory region, but embodiments of the present inventive concept are not limited thereto. For example, the storage device may perform any one of three or more actions for adjusting the size of the second memory region.

FIG. 14 illustrates a Q-table according to an embodiment of the present inventive concept.

The Q-table 500 of FIG. 14 may include reward values according to three actions for each of the 972 states. In the embodiment of FIG. 14, an action [1] may be an action of reducing a size of a second memory region, an action [2] may be an action of maintaining the size of the second memory region, and an action [3] may be an action of increasing the size of the second memory region. A storage device may select an action having the largest reward value among the three actions under a current state with reference to a Q-table, and may increase, maintain, or decrease the size of the second memory region according to the selected action.

Hereinafter, a structure of a memory device to which embodiments of the present inventive concept may be applied, and an example of a system to which embodiments of the present inventive concept may be applied will be described with reference to FIGS. 15 to 16.

Figure 15:
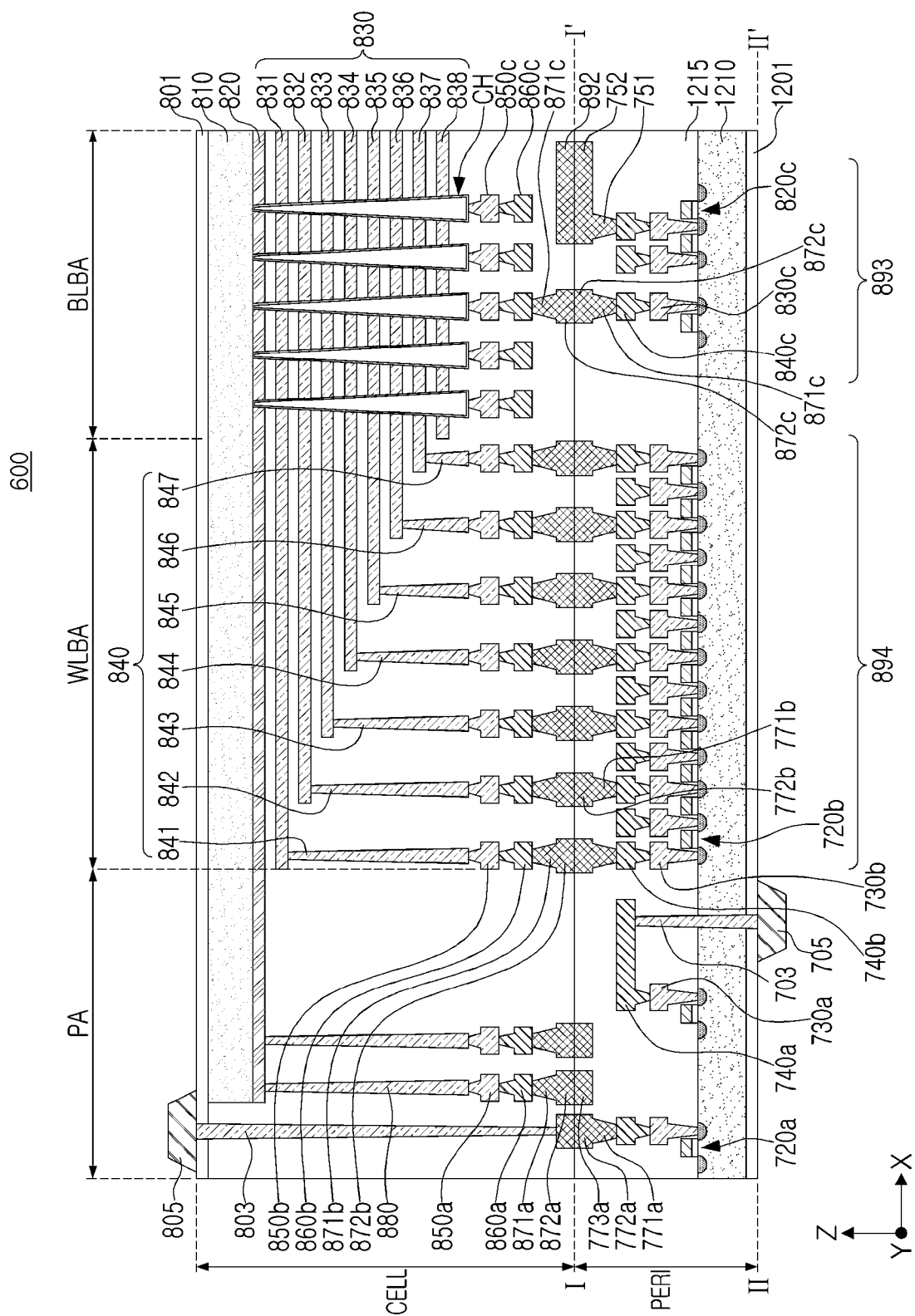
FIG. 15 is a cross-sectional view illustrating a memory device according to an embodiment of the present inventive concept.

FIG. 15 is a cross-sectional view illustrating a memory device according to an embodiment of the present inventive concept.

Referring to FIG. 15, a memory device 600 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then bonding the upper chip and the lower chip to each other by a bonding process. For example, the bonding process may refer to a method of electrically connecting a bonding metal formed on an uppermost metal layer of the upper chip and a bonding metal formed on an uppermost metal layer of the lower chip. For example, when the bonding metal is formed of copper (Cu), the bonding method may be a Cu—Cu bonding method, and the bonding metal may also be formed of aluminum or tungsten.

Each of the peripheral circuit region PERI and the cell region CELL of the memory device 600 may include an external pad bonding area PA, a word line bonding area WLBA, and a bit line bonding area BLBA. The peripheral circuit region PERI may include a first substrate 710, an interlayer insulating layer 715, a plurality of circuit elements 720a, 720b, and 720c formed on the first substrate 710, first metal layers 730a, 730b, and 730c respectively connected to the plurality of circuit elements 720a, 720b, and 720c, and second metal layers 740a, 740b, and 740c formed on the first metal layers 730a, 730b, and 730c. In an embodiment, the first metal layers 730a, 730b, and 730c may be formed of tungsten having relatively high electrical resistivity, and the second metal layers 740a, 740b, and 740c may be formed of copper having relatively low electrical resistivity.

In this specification, only the first metal layers 730a, 730b, 730c and the second metal layers 740a, 740b, and 740c are illustrated and described, but embodiments of the inventive concept are not limited thereto, and at least one or more metal layers may be further formed on the second metal layers 740a, 740b, and 740c. At least a portion of the one or more metal layers formed on the second metal layers 740a, 740b, and 740c may be formed of aluminum or the like having a lower resistance than copper forming the second metal layers 740a, 740b, and 740c.

The interlayer insulating layer 715 may be disposed on the first substrate 710 and at least partially cover the plurality of circuit elements 720a, 720b, and 720c, the first metal layers 730a, 730b, and 730c, and the second metal layers 740a, 740b, and 740c. The interlayer insulating layer 715 may include an insulating material such as silicon oxide, silicon nitride, or the like.

Lower bonding metals 771b and 772b may be formed on the second metal layer 740b in the word line bonding area WLBA. In the word line bonding area WLBA, the lower bonding metals 771b and 772b in the peripheral circuit region PERI may be electrically bonded to upper bonding metals 871b and 872b of the cell region CELL. The lower bonding metals 771b and 772b and the upper bonding metals 871b and 872b may be formed of aluminum, copper, tungsten, or the like. The upper bonding metals 871b and 872b of the cell region CELL may be referred to as first metal pads, and the lower bonding metals 771b and 772b of the peripheral circuit region PERI may be referred to as second metal pads.

The cell region CELL may include at least one memory block. The cell region CELL may include a second substrate 810 and a common source line 820. On the second substrate 810, a plurality of word lines 831 to 838 (i.e., 830) may be stacked in a direction (the Z-axis direction) perpendicular to an upper surface of the second substrate 810. A string select line and a ground select line may be arranged on and below the plurality of word lines 830, respectively, and the plurality of word lines 830 may be disposed between the at least one string select line and the at least one ground select line.

In the bit line bonding area BLBA, a channel structure CH may extend in a direction (the Z-axis direction), perpendicular to the upper surface of the second substrate 810, and pass through the plurality of word lines 830, the string select line, and the ground select line. The channel structure CH may include a data storage layer, a channel layer, a buried insulating layer, and the like, and the channel layer may be electrically connected to a first metal layer 850c and a second metal layer 860c. For example, the first metal layer 850c may be a bit line contact, and the second metal layer 860c may be a bit line. In an embodiment, the bit line may extend in the first direction (the Y-axis direction), parallel to the upper surface of the second substrate 810.

In the embodiment illustrated in FIG. 15, an area in which the channel structure CH, the bit line 860c, and the like are disposed may be defined as the bit line bonding area BLBA. In the bit line bonding area BLBA, the bit line may be electrically connected to the circuit elements 720c providing a page buffer 893 in the peripheral circuit region PERI. The bit line 860c may be connected to upper bonding metals 871c and 872c in the cell region CELL, and the upper bonding metals 871c and 872c may be connected to lower bonding metals 771c and 772c connected to the circuit elements 720c of the page buffer 893.

In the word line bonding area WLBA, the word lines 830 may extend in a second direction (an X-axis direction), parallel to the upper surface of the second substrate 810 and perpendicular to the first direction, and may be connected to a plurality of cell contact plugs 841 to 847 (i.e., 840). The plurality of word lines 830 and the plurality of cell contact plugs 840 may be connected to each other in pads provided by at least a portion of the plurality of word lines 830 extending in different lengths in the second direction. A first metal layer 850b and a second metal layer 860b may be connected to an upper portion of the plurality of cell contact plugs 840 connected to the plurality of word lines 830, sequentially. The plurality of cell contact plugs 840 may be connected to the peripheral circuit region PERI by the upper bonding metals 871b and 872b of the cell region CELL and the lower bonding metals 771b and 772b of the peripheral circuit region PERI in the word line bonding area WLBA.

The plurality of cell contact plugs 840 may be electrically connected to the circuit elements 720b forming a row decoder 894 in the peripheral circuit region PERI. In an embodiment, operating voltages of the circuit elements 720b of the row decoder 894 may be different than operating voltages of the circuit elements 720c forming the page buffer 893. For example, operating voltages of the circuit elements 720c forming the page buffer 893 may be greater than operating voltages of the circuit elements 720b forming the row decoder 894.

A common source line contact plug 880 may be disposed in the external pad bonding area PA. The common source line contact plug 880 may be formed of a conductive material, such as a metal, a metal compound, polysilicon, or the like, and may be electrically connected to the common source line 820. A first metal layer 850a and a second metal layer 860a may be stacked on an upper portion of the common source line contact plug 880, sequentially. For example, an area in which the common source line contact plug 880, the first metal layer 850a, and the second metal layer 860a are disposed may be defined as the external pad bonding area PA.

Input/output pads 705 and 805 may be disposed in the external pad bonding area PA. Referring to FIG. 13, a lower insulating film 701 at least partially covering a lower surface of the first substrate 710 may be formed below the first substrate 710, and a first input/output pad 705 may be formed on the lower insulating film 701. The first input/output pad 705 may be connected to at least one of the plurality of circuit elements 720a, 720b, and 720c disposed in the peripheral circuit region PERI through a first input/ output contact plug 703, and may be separated from the first substrate 710 by the lower insulating film 701. In addition, a side insulating film may be disposed between the first input/output contact plug 703 and the first substrate 710 to electrically separate the first input/output contact plug 703 and the first substrate 710.

Referring to FIG. 15, an upper insulating film 801 at least partially covering the upper surface of the second substrate 810 may be formed on the second substrate 810, and a second input/output pad 805 may be disposed on the upper insulating layer 801. The second input/output pad 805 may be connected to at least one of the plurality of circuit elements 720a, 720b, and 720c disposed in the peripheral circuit region PERI through a second input/output contact plug 803.

In some embodiments, the second substrate 810 and the common source line 820 may not be disposed in a region in which the second input/output contact plug 803 is disposed. Also, the second input/output pad 805 may not overlap the word lines 830 in the third direction (the Z-axis direction). Referring to FIG. 13, the second input/output contact plug 803 may be separated from the second substrate 810 in a direction, parallel to the upper surface of the second substrate 810, and may pass through an interlayer insulating layer 815 of the cell region CELL to be connected to the second input/output pad 805.

In some embodiments, the first input/output pad 705 and the second input/output pad 805 may be selectively formed. For example, the memory device 600 may include only the first input/output pad 705 disposed on the first substrate 710, or may include only the second input/output pad 805 disposed on the second substrate 810. In other embodiments, the memory device 600 may include both the first input/output pad 705 and the second input/output pad 805.

A metal pattern provided on an uppermost metal layer may be provided as a dummy pattern or the uppermost metal layer may be absent in each of the external pad bonding area PA and the bit line bonding area BLBA respectively included in the cell region CELL and the peripheral circuit region PERI.

In the external pad bonding area PA, the memory device 600 may include a lower metal pattern 773a, corresponding to an upper metal pattern 872a formed in an uppermost metal layer of the cell region CELL, and having the same cross-sectional shape as the upper metal pattern 872a of the cell region CELL to be connected to each other in an uppermost metal layer of the peripheral circuit region PERI. In the peripheral circuit region PERI, the lower metal pattern 773a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as the lower metal pattern of the peripheral circuit region PERI, may be formed in an uppermost metal layer of the cell region CELL.

The lower bonding metals 771b and 772b may be formed on the second metal layer 740b in the word line bonding area WLBA. In the word line bonding area WLBA, the lower bonding metals 771b and 772b of the peripheral circuit region PERI may be electrically connected to the upper bonding metals 871b and 872b of the cell region CELL by bonding.

Further, in the bit line bonding area BLBA, an upper metal pattern 892, corresponding to a lower metal pattern 752 formed in the uppermost metal layer of the peripheral circuit region PERI, and having the same cross-sectional shape as the lower metal pattern 752 of the peripheral circuit region PERI, may be formed in an uppermost metal layer of the cell region CELL. A contact may not be formed on the upper metal pattern 892 formed in the uppermost metal layer of the cell region CELL.

In the example embodiment, a reinforced metal pattern, corresponding to a metal pattern formed on the uppermost metal layer of one of the cell region CELL and the peripheral circuit region PERI, and having the same cross-sectional shape as a metal pattern formed on the uppermost metal layer of the other one of the cell region CELL and the peripheral circuit region PERI, may be formed. A contact may not be formed in the reinforced metal pattern.

The memory device 600 may include memory regions having different bit-densities according to the number of bits stored in the memory cells. Data received from the host may be stored separately in memory regions having different bit-densities according to attributes. According to an embodiment of the present inventive concept, reinforcement learning may be performed to adjust the size of the memory regions, such that the memory regions may be worn more evenly under the current state generated based on the data distribution amount for each memory region and the size of each memory region in a unit cycle. And, under the current state, the size of the memory regions may be dynamically adjusted based on reinforcement learning. According to an embodiment of the present inventive concept, the plurality of memory regions may be more uniformly worn despite the change in the workload pattern of the host, and the lifespan of the memory device 600 may be improved.

Figure 16:
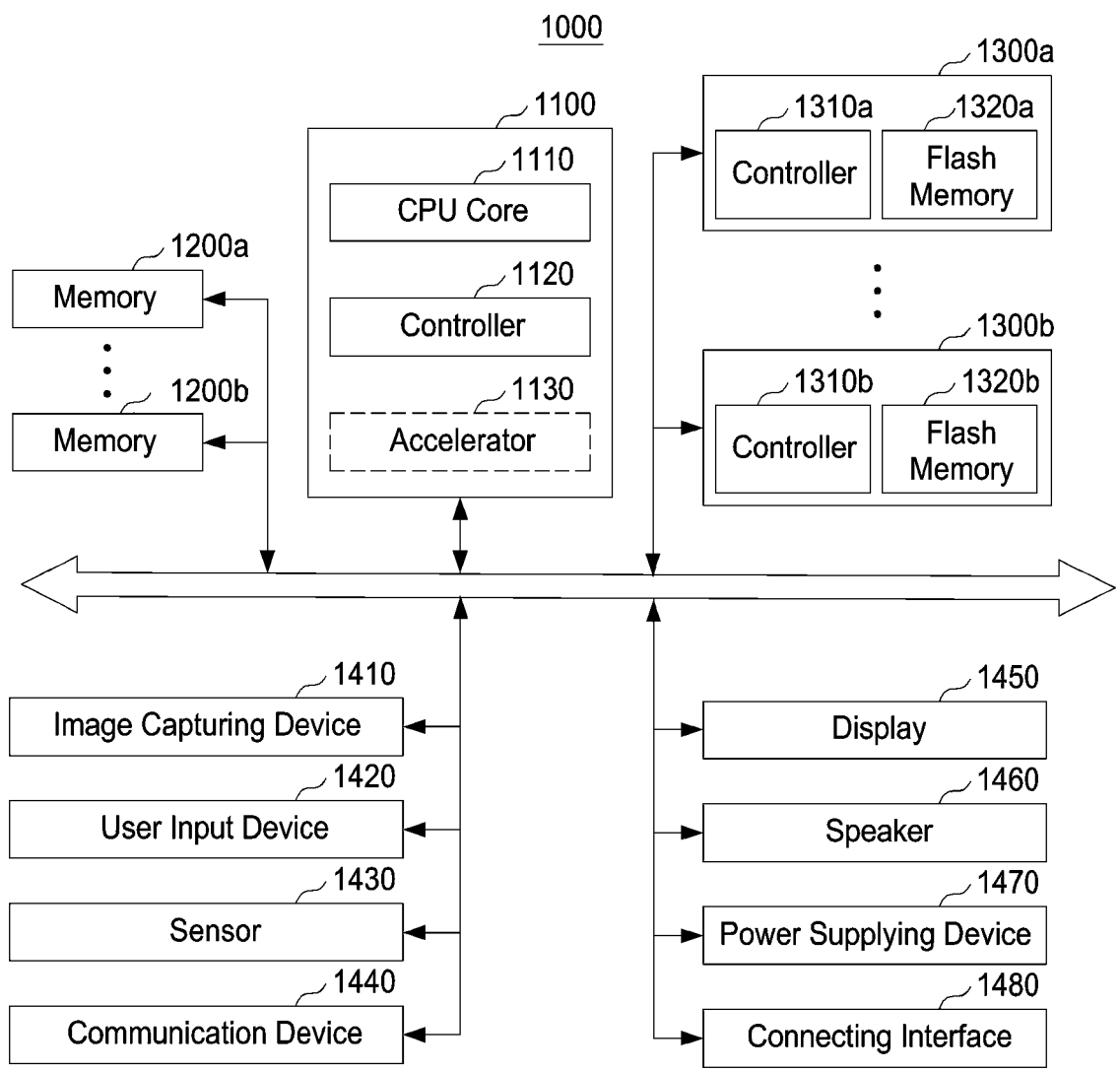
FIG. 16 is a diagram illustrating a system to which a storage device according to an embodiment of the present inventive concept is applied.

FIG. 16 is a view illustrating a system 1000 to which a storage device according to an embodiment of the present inventive concept is applied.

The system 1000 of FIG. 16 may be a mobile system, such as a mobile phone, a smartphone, a tablet personal computer (PC), a wearable device, a healthcare device, or an internet-of-things (IOT) device. The system 1000 of FIG. 16 is not limited to mobile system embodiments, and may be embodied in systems or devices, such as a personal computer, a laptop computer, a server, a media player, an automotive device such as a navigation system, or the like.

Referring to FIG. 16, the system 1000 may include a main processor 1100, memories 1200a and 1200b, and storage devices 1300a and 1300b, and may further include at least one of an image capturing device 1410, a user input device 1420, a sensor 1430, a communication device 1440, a display 1450, a speaker 1460, a power supplying device 1470, or a connecting interface 1480.

The main processor 1100 may be configured to control an overall operation of the system 1000, and more specifically, operations of other components constituting the system 1000. The main processor 1100 may be implemented as a general-purpose processor, a dedicated processor, an application processor, or the like.

The main processor 1100 may include at least one CPU core 1110 and may further include a controller 1120 for controlling the memories 1200a and 1200b and/or the storage devices 1300a and 1300b. According to an embodiment, the main processor 1100 may further include an accelerator 1130 that may be a dedicated circuit for high-speed data operation such as artificial intelligence (AI) data operation. The accelerator 1130 may include a graphics processing unit (GPU), a neural processing unit (NPU), and/or a data processing unit (DPU), or the like, and may be implemented as a separate chip, physically independent from other components of the main processor 1100.

The memories 1200a and 1200b may be used as a main memory device of the system 1000, and may include volatile memories such as SRAM and/or DRAM, or the like, but may also include non-volatile memories such as flash memory, PRAM, and/or RRAM, or the like. The memories 1200a and 1200b may be implemented together with the main processor 1100 in the same package.

The storage devices 1300a and 1300b may function as non-volatile storage devices that store data regardless of whether power is supplied or not, and may have a relatively larger storage capacity, as compared to the memories 1200a and 1200b. The storage devices 1300a and 1300b may include storage controllers 1310a and 1310b, and non-volatile memories (NVM) 1320a and 1320b for storing data under control of the storage controllers 1310a and 1310b. The non-volatile memories 1320a and 1320b may include a flash memory having a 2D (2-dimensional) structure or a 3D (3-dimensional) vertical NAND (V-NAND) structure, but may include other types of non-volatile memory such as PRAM and/or RRAM, or the like.

The storage devices 1300a and 1300b may be included in the system 1000 in a state physically separated from the main processor 1100, or may be implemented together with the main processor 1100 in the same package. In addition, the storage devices 1300a and 1300b may have a shape such as a solid state device (SSD) or a memory card, to be detachably coupled to other components of the system 1000 through an interface such as a connecting interface 1480 to be described later. Such storage devices 1300a and 1300b may be devices to which standard protocols such as a universal flash storage (UFS), an embedded multi-media card (eMMC), or a non-volatile memory express (NVMe) are applied, but embodiments of the present inventive concept are not necessarily limited thereto.

The storage devices 1300a and 1300b according to an embodiment of the present inventive concept may include memory regions having different bit-densities. The storage devices 1300a and 1300b may provide an improved lifespan by dynamically adjusting the sizes of memory regions using reinforcement learning.

The image capturing device 1410 may be configured to capture a still image or a moving image, and may be a camera, a camcorder, and/or a webcam, or the like.

The user input device 1420 may be configured to receive various types of data of the system 1000, input by a user, and may be a touch pad, a keypad, a keyboard, a mouse, and/or a microphone, or the like.

The sensor 1430 may be configured to detect various types of physical quantities that may be acquired from the outside of the system 1000, and may be configured to convert the sensed physical quantities into electrical signals. Such a sensor 1430 may be a temperature sensor, a pressure sensor, an illuminance sensor, a position sensor, an acceleration sensor, a biosensor, and/or a gyroscope sensor, or the like.

The communication device 1440 may be configured to transmit and receive signals between other devices outside the system 1000 according to various communication protocols. Such a communication device 1440 may be implemented to include an antenna, a transceiver, and/or a modem, or the like.

The display 1450 and the speaker 1460 may function as output devices that respectively output visual information and auditory information to the user of the system 1000.

The power supplying device 1470 may appropriately convert power supplied from a battery (not illustrated) mounted in the system 1000 and/or an external power source, and may supply the switched power to each of the components of the system 1000.

The connecting interface 1480 may be configured to provide a connection between the system 1000 and an external device that may be connected to the system 1000 and may exchange data with the system 1000. The connecting interface 1480 may be implemented in various interface methods such as an advanced technology attachment (ATA), a serial ATA (SATA), an external SATA (e-SATA), a small computer small interface (SCSI), a serial attached SCSI (SAS), a peripheral component interconnection (PCI), a PCI express (PCIe), NVMe, IEEE 1394, a universal serial bus (USB), a secure digital (SD) card, a multi-media card (MMC), an eMMC, a UFS, an embedded universal flash storage (eUFS), a compact flash (CF) card interface, or the like.

According to an embodiment of the present inventive concept, a storage device capable of improving a lifespan of a memory device including memory regions having different bit-densities, and a method of operating the same may be provided.

Specifically, the present inventive concept may improve a lifespan of a memory device by increasing or decreasing sizes of memory regions having different bit-densities, such that the memory regions may be worn more evenly based on a reinforcement learning result.

While example embodiments have been illustrated and described above, it will be apparent to those skilled in the art that modifications and variations could be made without departing from the scope of the present inventive concept as defined by the appended claims.

What is claimed is:

1. A storage device comprising:
a memory device including a first memory region, a second memory region, and a third memory region, the first memory region having a lowest bit-density relative to the second memory region and the third memory region, the second memory region having a medium bit-density relative to the first memory region and the third memory region, and the third memory region having a highest bit-density relative to the first memory region and the second memory region; and
a controller configured to control the memory device,
wherein the controller is configured to distribute data received from a host to the first to third memory regions based on attributes of the data, to determine a current state based on a data distribution amount for each of the first to third memory regions and a respective size of each of the first to third memory regions, and to perform an action of increasing or decreasing a size of the second memory region under the current state based on a reinforcement learning result for mitigating a reduction in lifespan of the third memory region.

2. The storage device of claim 1, wherein the current state is determined based on a plurality of factors, and
wherein the plurality of factors comprise:
a first memory region data ratio of an amount of data distributed to the first memory region to an amount of data received from the host in a unit period;
a second memory region data ratio of an amount of data distributed to the second memory region to the amount of data received from the host in the unit period;
a first memory size ratio of a size of the first memory region to an overall storage capacity of the memory device in a current period; and a current second memory size ratio of a size of the second memory region to the overall storage capacity of the memory device in the current period.

3. The storage device of claim 2, wherein the plurality of factors further comprise a previous second memory size ratio of a size of the second memory region to an overall storage capacity of the memory device in a previous period.

4. The storage device of claim 1, wherein the controller is configured to repeatedly perform operations as follows over a plurality of cycles to generate a reinforcement learning result:
   an action of increasing or decreasing the size of the second memory region under the current state determined based on the data distribution amount for each of the first to third memory regions and the respective size of each of the first to third memory regions,
   collecting wear level information of the memory device after the action of increasing or decreasing the size of the second memory region,
   determining a reward based on the wear level information, and
   determining the reward for an action performed under the current state.

5. The storage device of claim 4, wherein the wear level information comprises an erase count increment in a unit period with respect to a limit erase count of memory blocks included in the third memory region.

6. The storage device of claim 5, wherein the controller is configured to determine the reward such that the reward increases in value as the wear level information decreases in value.

7. The storage device of claim 1, wherein the controller is configured to provide data from the host to any one of the first to third memory regions based on hotness of the data, and to migrate data stored in the first or second memory region to the third memory region based on a size of free space of the first and second memory regions.

8. The storage device of claim 1, wherein the first memory region comprises single level cell (SLC) memory blocks, wherein the second memory region comprises triple level cell (TLC) memory blocks, and
   wherein the third memory region comprises quadruple level cell (QLC) memory blocks.

9. The storage device of claim 8, wherein the controller is configured to convert a TLC memory block included in the second memory region into a QLC memory block, based on the reinforcement learning result, to decrease a size of the second memory region, or to convert a QLC memory block included in the third memory region into a TLC memory block to increase a size of the second memory region.

10. A storage device comprising:
   a memory device including a first memory region, a second memory region, and a third memory region, the first memory region having a lowest bit-density relative to the second memory region and the third memory region, the second memory region having a medium bit-density relative to the first memory region and the third memory region, and the third memory region having a highest bit-density relative to the first memory region and the second memory region; and
   a controller configured to control the memory device, wherein the controller is configured to distribute data received from a host to the first to third memory regions based on attributes of the data, and to repeatedly perform operations as follows over a plurality of cycles to generate a reinforcement learning result:
   an action of increasing or decreasing a size of the second memory region under a current state determined based on a data distribution amount for each of the first to third memory regions and a respective size of each of the first to third memory regions,
   collecting wear level information of the memory device after the action of increasing or decreasing the size of the second memory region,
   determining a reward based on the wear level information, and
   determining the reward for an action performed under the current state.

11. The storage device of claim 10, wherein the reinforcement learning result comprises a Q-table indicating a plurality of sizes of a reward for an action for a plurality of states that the storage device may have, respectively.

12. The storage device of claim 10, wherein the current state is determined based on a plurality of factors, and
   wherein the plurality of factors comprise:
   a first memory region data ratio of an amount of data distributed to the first memory region to an amount of data received from the host in a unit period;
   a second memory region data ratio of an amount of data distributed to the second memory region to the amount of data received from the host in the unit period;
   a first memory size ratio of a size of the first memory region to an overall storage capacity of the memory device in a current period; and
   a current second memory size ratio of a size of the second memory region to the overall storage capacity of the memory device in the current period.

13. The storage device of claim 10, wherein the wear level information comprises an erase count increment in a unit period with respect to a limit erase count of memory blocks included in the third memory region.

14. The storage device of claim 13, wherein the controller is configured to determine the reward such that the reward increases in value as the wear level information decreases in value.

15. The storage device of claim 10, wherein the controller is configured to determine the current state based on the data distribution amount for each of the first to third memory regions and the size of each of the first to third memory regions, and an action to increase or decrease a size of the second memory region under the current state to increase a size of the reward.

16. A method of operating a storage device including memory regions having different bit-densities, comprising:
   determining a current state based on a data distribution amount for each of the memory regions, the data distribution amount being based on a ratio of an amount of data distributed to the respective memory region to an amount of data received from a host in a unit period, and a size of each of the memory regions, the size being represented as a ratio of the size of the respective memory region to an overall storage capacity of the storage device in a current period;
   performing an action of increasing or decreasing a size of one or more of the memory regions based on the current state;
   determining a reward based on a wear level of the storage device determined for the action;
   generating a reinforcement learning result using the current state, the action, and the reward; and
   adjusting a size of one or more of the memory regions using the reinforcement learning result.

17. The method of claim 16, wherein determining the reward based on the wear level of the storage device, comprises determining a reward value as a higher value as an erase count increment of one of the memory regions having a highest bit-density among the memory regions is lowered in a unit period.

18. The method of claim 16, wherein adjusting the size of one or more of the memory regions using the reinforcement learning result, comprises performing an action of increasing or decreasing the size of one or more of the memory regions based on whether the action of increasing or the action of decreasing has a higher reward value under the current state.

19. The method of claim 16, wherein adjusting the size of one or more of the memory regions using the reinforcement learning result, comprises performing a first action of increasing or decreasing a size of one or more of the memory regions, or a second action of maintaining sizes of the memory regions based on which of the first action and the second action has a highest reward value under the current state.

20. The method of claim 16, wherein generating the reinforcement learning result is performed at the beginning of use of the storage device.

* * * * *